US012685104B2

(12) United States Patent
Rivero et al.

(10) Patent No.: US 12,685,104 B2
(45) Date of Patent: Jul. 14, 2026

(54) CONTACT FOR ELECTRONIC COMPONENT

(71) Applicant: STMicroelectronics (Rousset) SAS, Rousset (FR)

(72) Inventors: Christian Rivero, Rousset (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 553 days.

(21) Appl. No.: 18/109,569

(22) Filed: Feb. 14, 2023

(65) Prior Publication Data

US 2023/0260835 A1     Aug. 17, 2023

(30) Foreign Application Priority Data

Feb. 15, 2022     (FR) ...................................... 2201326

(51) Int. Cl.
*H10W 20/00* (2026.01)
*H10W 20/41* (2026.01)
*H10W 20/42* (2026.01)

(52) U.S. Cl.
CPC ....... *H10W 20/035* (2026.01); *H10W 20/034* (2026.01); *H10W 20/049* (2026.01); *H10W 20/056* (2026.01); *H10W 20/42* (2026.01); *H10W 20/425* (2026.01)

(58) Field of Classification Search
CPC ......... H01L 21/76846; H01L 21/76844; H01L 21/76858; H01L 21/28518; H01L 21/76843; H01L 23/5226; H01L 23/53238; H01L 23/53266; H10W 20/034; H10W 20/035; H10W 20/033; H10W 20/425; H10W 20/42; H10W 20/056; H10W 20/049; H10W 20/047
See application file for complete search history.

(56) References Cited

U.S. PATENT DOCUMENTS

| | | | |
|---|---|---|---|
| 5,504,038 A | 4/1996 | Chien et al. | |
| 5,985,749 A * | 11/1999 | Lin | .................... H01L 21/76843 438/623 |
| 6,194,315 B1 * | 2/2001 | Hu | .................... H01L 21/76855 438/630 |

(Continued)

OTHER PUBLICATIONS

INPI Search Report and Written Opinion for priority application, FR 2201326, report dated Oct. 21, 2022, 10 pgs.

*Primary Examiner* — John M Parker

(74) *Attorney, Agent, or Firm* — Crowe & Dunlevy LLC

(57) ABSTRACT

A method of manufacturing a contact on a semiconductor region includes a step of forming a stack of layers on lateral walls and at a bottom of an orifice (aligned with the semiconductor region) crossing a dielectric region along a longitudinal direction. The step of forming step is carried out from a first surface of the dielectric region and includes forming a polysilicon layer and a layer of a first metal in contact with the polysilicon layer. The first metal is preferably a metal selected from the group of transition metals and is well suited to forming with the polysilicon layer a metal silicide. The method further includes a step of performing thermal anneal causing a reaction between the first metal and the polysilicon layer to produce a layer of metal silicide. At least a portion of that layer of metal silicide extends in the longitudinal direction of the orifice.

19 Claims, 11 Drawing Sheets

(56)          References Cited

U.S. PATENT DOCUMENTS

| | | |
|---|---|---|
| 2006/0278985 A1 | 12/2006 | Lim et al. |
| 2010/0117237 A1* | 5/2010 | Coolbaugh ....... H01L 21/76224 |
| | | 257/E23.141 |
| 2012/0161324 A1 | 6/2012 | Heinrich et al. |

* cited by examiner

CONTACT FOR ELECTRONIC COMPONENT

PRIORITY CLAIM

This application claims the priority benefit of French Application for Patent No. 2201326, filed on Feb. 15, 2022, the content of which is hereby incorporated by reference in its entirety to the maximum extent allowable by law.

TECHNICAL FIELD

The present disclosure generally relates to electronic devices and, more particularly, semiconductor-based electronic components.

BACKGROUND

In an electronic device such as an integrated circuit, electronic components are generally connected to a first metal level of an interconnection portion (known by those skilled in the art the Back End Of Line ("BEOL"). In particular, certain electronic components, such as transistors, diodes, etc., comprise semiconductor regions electrically connected to the first metal level. Typically, a transistor, for example, of MOS type, comprises such drain, source, and/or gate semiconductor regions. For these semiconductor regions, the electric connection is generally ensured by an electrically-conductive pad, or contact, in direct contact on the one hand with the semiconductor region and the other hand with the first metal level.

A resistance of the electric contact between the semiconductor region and the first metal level which is the smallest possible is generally desired.

This may be desired for applications where it is desired to minimize the voltage resistance of a transistor in the on state, known under denomination "Ron", without for this to impact other performance factors of the transistor, for example, the off capacitance, known under denomination "Coff" that may also be desired to be minimized. In particular, this may be desired, when it becomes difficult to act on the parameters of a transistor, for example, on the channel or the gate, to minimize both the Ron and the Coff.

The minimizing of the Ron and of the Coff is, for example, desired for electronic components used in radio frequency (RF) communication applications, for example, for RF signal switching technologies (RF switch) and/or radio antenna front-end modules (FEM).

There is a need for an electric contact between a semiconductor region of an electronic component and a first metal level of an interconnection portion, having the lowest possible resistance.

There is a need to overcome all or part of the disadvantages of known electronic component contacts.

SUMMARY

An embodiment provides a method of manufacturing a contact on a semiconductor region of an electronic component, said method comprising: forming a stack of layers adapted to be electrically conductive on the lateral walls and at the bottom of an orifice crossing a dielectric region of the electronic component along a longitudinal direction, the bottom of the orifice being aligned with the semiconductor region, said forming being carried out from a first surface of said dielectric region and comprising forming of a polysilicon layer and a layer of a first metal in contact with the polysilicon layer, said first metal being selected from the group of transition metals, and being adapted to forming with the polysilicon a metal silicide; and then performing a thermal anneal adapted to having the first metal and the polysilicon react, resulting in the forming of a layer of metal silicide comprising at least a portion extending in the longitudinal direction of the orifice.

According to an embodiment, the electronic component comprises a silicide interface layer intended to form an interface between said semiconductor region and the contact, the bottom of the orifice emerging onto said silicide interface layer.

According to an embodiment, the thermal anneal is performed at a temperature in the range from 500° C. to 850° C., for example, between 675° C. and 850° C., and/or for a duration in the range from 30 seconds to 5 minutes.

According to an embodiment, the polysilicon layer is formed before the layer of the first metal.

According to an embodiment, the polysilicon layer is formed on the lateral wall and at the bottom of the orifice, and the layer of the first metal is formed on the polysilicon layer.

According to a specific embodiment, forming further comprises forming a diffusion barrier layer, after forming the layer of the first metal, on said layer of the first metal.

According to a specific embodiment, forming further comprises filling the orifice resulting in the forming of a filling layer made of a second metal, said filling being performed after forming the layer of the first metal, or after forming the diffusion barrier layer.

According to an embodiment, the layer of the first metal is formed before the polysilicon layer.

According to an embodiment, the layer of the first metal is formed on the lateral walls and at the bottom of the orifice, before the polysilicon layer.

According to a specific embodiment, forming further comprises forming a diffusion barrier layer before the layer of the first metal, and in contact with said layer of the first metal.

According to a specific embodiment, forming further comprises forming a bonding layer on the lateral walls and at the bottom of the orifice, before the layer of the first metal, and in contact with said layer of the first metal, or before the diffusion barrier layer, and in contact with said barrier layer.

According to a specific embodiment, forming comprises etching, at least at the bottom of the orifice, a portion of the diffusion barrier layer and/or a portion of the bonding layer, the etching being before forming the layer of the first metal.

According to a specific embodiment, forming the polysilicon layer corresponds to a filling of the orifice.

According to an embodiment, the method further comprises planarizing the layers of the stack, adapted to making the contact flush with the first surface of the dielectric region, wherein planarizing comprises, for example, a chemical-mechanical polishing.

An embodiment provides an electronic component comprising at least one contact on at least a semiconductor region of an electronic component, the contact being arranged in an orifice crossing a dielectric region of the electronic component along a longitudinal direction from a first surface of said dielectric region, the bottom of the orifice being aligned with the semiconductor region, said contact comprising a metal silicide layer comprising at least a portion extending in the longitudinal direction of the orifice.

According to one embodiment, the contact comprises a filling layer within the orifice that is made of a second metal.

According to one embodiment, the contact comprises a filling layer within the orifice, said filling layer being made of polysilicon and covering the metal silicide layer.

According to an embodiment, the electronic component comprises a silicide interface layer between the semiconductor region and the contact, the bottom of the orifice emerging onto said silicide interface layer.

According to an embodiment, the metal silicide layer has a U shape, comprising first and second portions extending in the longitudinal direction of the orifice, coupled by a third portion at the level of the bottom of the orifice.

According to an embodiment, a portion of the metal silicide layer, for example the third portion, is in direct contact with the semiconductor region or the silicide interface layer.

According to an embodiment, the electronic component comprises, for example is, a MOS-type transistor arranged inside and on top of a substrate, the transistor comprising a gate semiconductor region covering a channel region located between a doped drain semiconductor region and a doped source semiconductor region, at least one contact being arranged on the drain semiconductor region, the source semiconductor region, and/or the gate semiconductor region, a silicide interface layer being for example interposed between said semiconductor region and the contact.

According to embodiments: the first metal is selected from among: titanium, cobalt, platinum, nickel, tungsten; the second metal is tungsten or copper; the metal silicide is a titanium silicide, a cobalt silicide, or a nickel silicide; the third metal is titanium, cobalt, or nickel; and/or the diffusion barrier layer comprises titanium nitride and/or a tantalum/tantalum nitride bilayer.

An embodiment provides an electronic device comprising at least one electronic component according to an embodiment.

According to an embodiment, said device is a radio frequency signal switch.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the manufacturing steps and the details of the elements of an electronic component (other than the contacts concerned by the embodiments), such as the drain, the source, the channel, and the gate for a MOS transistor, are not detailed, since they can be formed with usual electronic component manufacturing methods.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred unless specified otherwise to the orientation of the drawings or to an electronic component in a normal position of use.

In the following description, when reference is made to the longitudinal direction of the orifice, one should understand the direction along which the orifice crosses the dielectric region or, in other words, the direction corresponding to the depth of the orifice.

Unless specified otherwise, the expressions "around", "approximately", "substantially" and "in the order of" signify within 10%, and preferably within 5%.

Figure 1A:
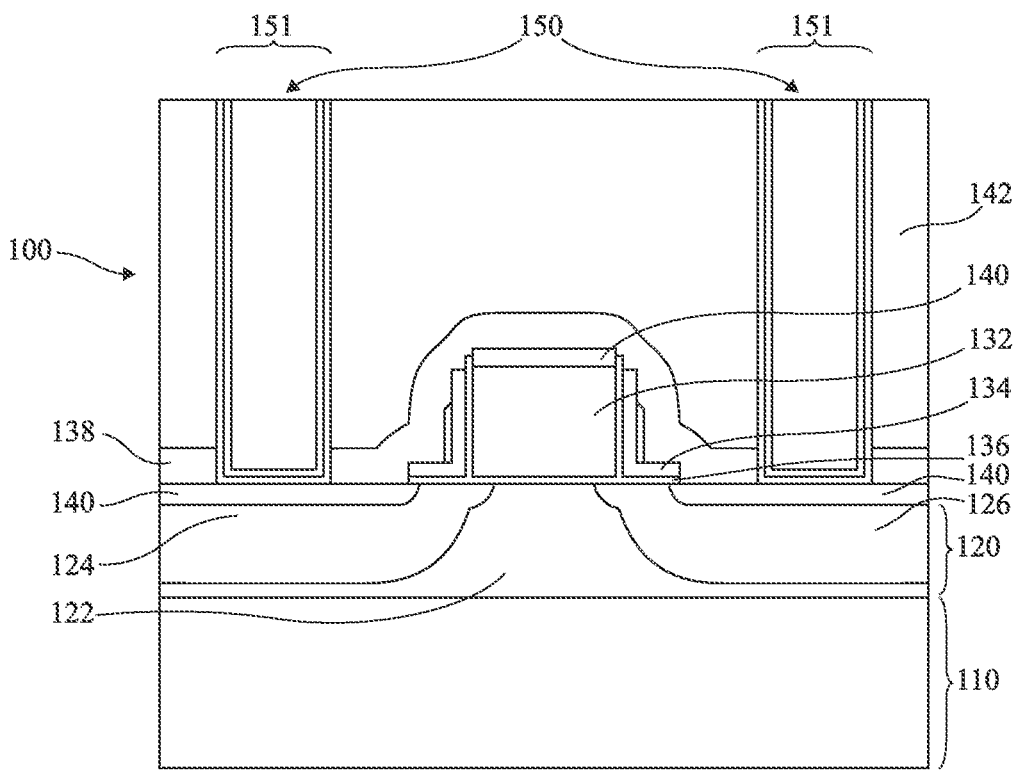
FIG. 1A is a cross-section view of an example of an electronic component.
Figure 1B:
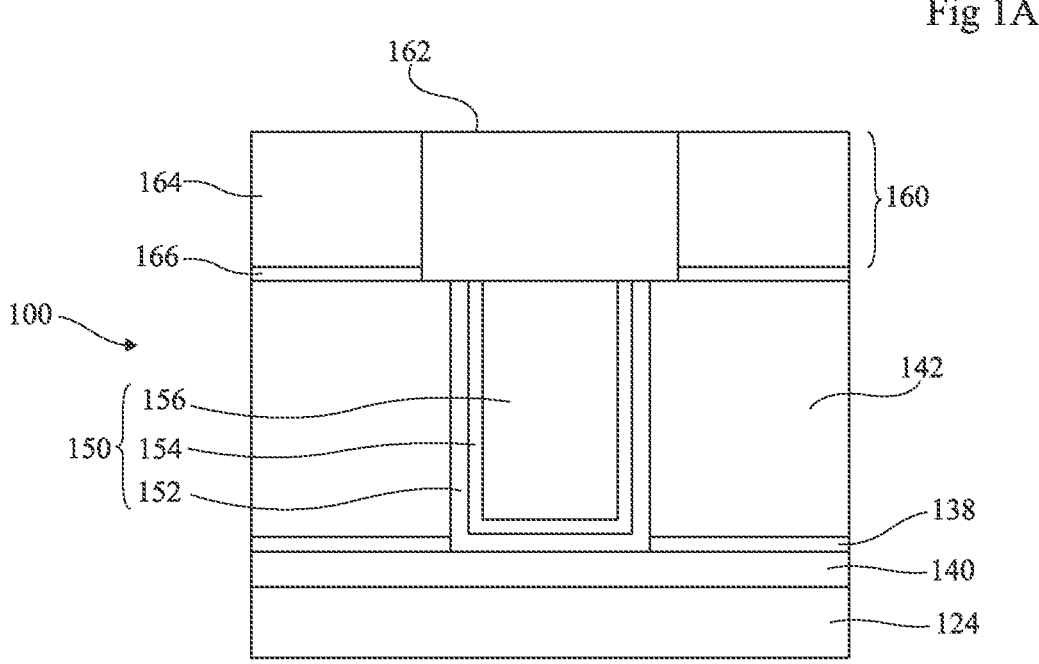
FIG. 1B schematically shows a detail in cross-section of a contact of an electronic component similar to the component of FIG. 1A.

FIG. 1A is a cross-section of an example of an electronic component 100. FIG. 1B schematically shows in cross-section a detail of a contact of an electronic component similar to the component of FIG. 1B.

The shown electronic component comprises, or is, a metal oxide semiconductor (MOS) type transistor. The transistor is located inside and on top of a substrate 120. The substrate is a semiconductor, preferably made of silicon. One has shown under the substrate a layer of insulator 110, for example, a layer known by those skilled in the art as a buried oxide ("BOX") layer. For example, the substrate is a silicon film on the BOX, itself on another silicon substrate, according to a Silicon On Insulator (SOI) substrate technology.

The transistor comprises a gate region 132 covering a channel-forming region 122 located between two doped semiconductor regions, respectively drain 124 and source 126. These semiconductor regions are connected to a first metal level 162 of a portion of interconnection 160 with electrically-conductive pads, or contacts 150. In other words, a contact is coupled, preferably connected, on the one hand to the semiconductor region and on the other hand to the first metal level. Although this is not shown, a contact may also be provided between the first metal level and the gate region.

Gate region 132 is generally made of polysilicon (polycrystalline silicon). It may be flanked by an insulating lateral region or spacer 134. Further, the gate region is generally insulated from the channel and/or from the spacer by a gate oxide layer 136.

The transistor is preferably delimited by insulating trenches (not shown), typically of Shallow Trench Isolation ("STI") type. Such trenches may result from an etching and a filling, by an electric insulator, of the etched portions. The insulator is, for example, an oxide such as a silicon oxide.

It may be provided to form a metal silicide layer 140 (designated as "silicide") at the interface between semiconductor region 122, 124 and contact 150. Such a silicide layer enables to strongly decrease the value of the electric access resistance of the contact, that is, the resistance between the semiconductor region and the contact. For example, as illustrated in FIG. 1A, the drain, source, or even gate regions, may comprise metal silicide portions in front of the contacts to enable to decrease the access resistance.

Further, as illustrated in FIG. 1A, an etch stop layer 138, typically made of silicon nitride (SiN), for the future etching of the contact, may be arranged on the drain, source, and gate regions, and particularly on the silicide layers. The etch stop layer is topped with a region of a dielectric material 142, for example, made of a dielectric material known by those skilled in the art as a Pre Metal Dielectric ("PMD") layer. According to an example, the PMD is more or less heavily doped silicon dioxide ($SiO_2$).

An example of a method of manufacturing a contact, comprising the prior forming of a metal silicide interface layer, is the following, described by using the numerical references of FIGS. 1A and 1B.

After an anneal of the concerned semiconductor regions, for example a source region and/or a drain region, for example performed at 1,030° C. for a few seconds, one protects the regions that must not be silicided with a specific mask, generally formed of a bilayer of silicon oxide and of silicon nitride.

Then, a full plate deposition of a cobalt/titanium nitride (Co/TiN) bilayer is performed. A first rapid thermal treatment (rapid anneal), typically at 530° C. for a few seconds, to form cobalt monosilicide (CoSi) is then performed. Such a rapid thermal anneal is known by those skilled in the art as Rapid Thermal Processing ("RTP").

The Co/TiN bilayer is then removed, and a densification anneal is performed, typically at 830° C. for a few seconds, which results in transforming the cobalt mono silicide into cobalt disilicide ($CoSi_2$) forming silicide layer 140 on each semiconductor region, after which a deposition of a stop layer 138 is performed for the future etching of the contact, for example silicon nitride (SiN).

Then, a dielectric layer 142 is formed by means of a dielectric material, for example, a PMD, on stop layer 138.

An etching of a through opening 151 is then performed in dielectric region 142 to form the location of the future electric contact. Preferably, the orifice crosses etch stop layer 138 all the way to silicide layer 140 ($CoSi_2$).

A layer of titanium (Ti) 152 and then a layer of titanium nitride (TiN) 154 forming a diffusion barrier layer are then deposited on the lateral wall and at the bottom of the orifice (on the silicide layer). Then, the orifice is filled with a filling metal 156, for example, made of tungsten (W).

A first metal level 162 of interconnection portion 160 may then be formed on each contact, for example copper (Cu) or aluminum (Al) pads, said metal pads being isolated by a dielectric material 164, for example, a silicon oxide comprising carbon (SiOC), of a silicon phosphide known as Phospho-Silicon Glass ("PSG"). An etch stop layer 166, for example made of silicon carbonitride (SiCN), may be provided before forming the first metal level, in anticipation of the etching (of the metal or of the dielectric according to the implemented method) to form said first metal level in the dielectric material of the interconnection portion.

Concerning the contact 150 formed by this method, and in particular the interface between the silicided semiconductor region and the contact, it can be observed that layers 152, 154, respectively made of Ti and TiN are interposed between the silicide layer and the tungsten, which increases the access resistance of the contact. Further, by adding the resistance of tungsten, the general resistance of the contact between the silicided semiconductor region and the first metal level remains significant due to the resistance stacking of layers 152, 154, 156 respectively made of Ti, TiN, and W.

Embodiments herein provide a contact on a semiconductor region and a method of manufacturing such a contact enabling to answer the previously-described improvement needs, and to overcome all or part of the disadvantages of the previously-described contacts. In particular, the embodiments herein provide a contact and a method of manufacturing such a contact enabling to decrease the access resistance, as well as the general resistance of said contact.

Embodiments of contacts will be described hereafter. The described embodiments are non-limiting and various variants will occur to those skilled in the art based on the indications of the present disclosure.

In the described embodiments, the contact is an electric contact of an electronic component, for example, a MOS-type transistor such as that described in relation with FIGS. 1A and 1B. The contact is preferably formed on a silicided semiconductor region, that is, topped with a silicide interface layer, for example, a source region and/or a drain region, or even a gate region.

Further, the initial structure of the described embodiments is a structure originating from a method of manufacturing a through orifice for the location of the future contact on the semiconductor region, with the prior forming of a silicide interface layer on said semiconductor region. For example, the initial structure may be a structure originating from a method similar to that described in relation with FIGS. 1A and 1B until the step (included) of etching of the orifice in dielectric region 142. Orifice 251 crosses stop layer 138 to emerge onto silicide interface layer 140.

In the shown embodiments, the longitudinal direction of the orifice substantially corresponds to the vertical direction.

FIGS. 2A to 2F are cross-section views showing a method of manufacturing a contact 250 according to an embodiment.

Figure 2A:
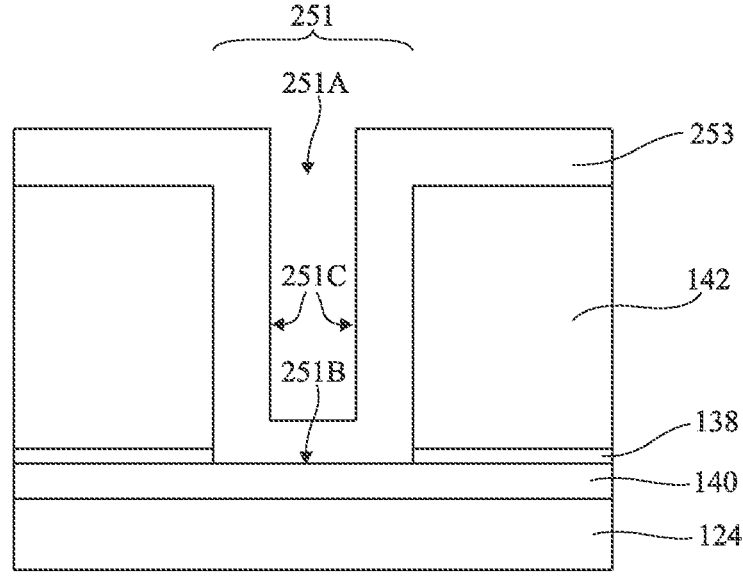
FIG. 2A, FIG. 2B, FIG. 2C, FIG. 2D, FIG. 2E, and FIG. 2F are cross-section views showing steps of a contact manufacturing method according to an embodiment.

FIG. 2A shows the structure obtained at the end of the deposition of a polysilicon layer 253 on the initial structure, and in particular on the lateral walls 251C and at the bottom 251B or orifice 251. This deposition method may, for example, be formed by using a technique of chemical vapor deposition ("CVD"), or by epitaxy. As an example, layer 253 has a uniform thickness of approximately 50 nanometers (nm).

Figure 2B:
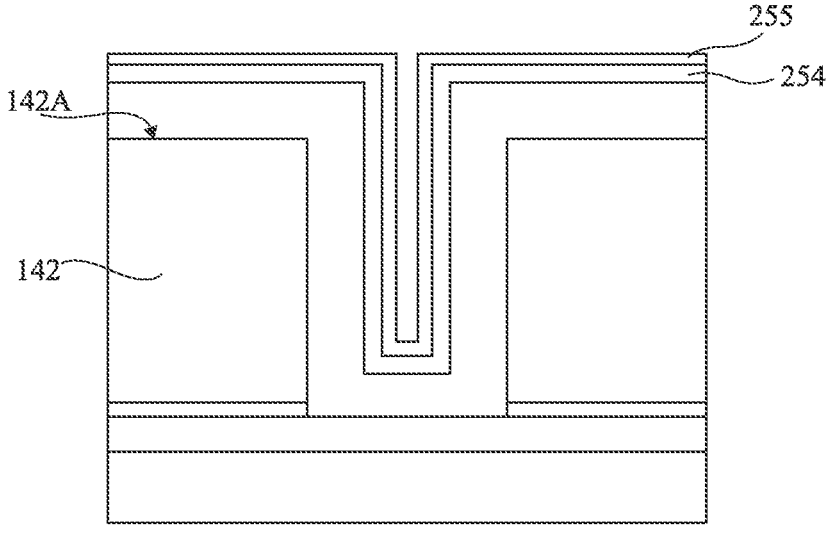

FIG. 2B shows the structure obtained at the end of the deposition of a layer 254 of titanium (Ti) (first metal) on layer 253 and then of a layer 255 of titanium nitride (TiN) on layer 254. Thus, titanium layer 254 is in contact with polysilicon layer 253. These depositions may, for example, be formed by using a CVD technique, or a technique of physical vapor deposition ("PVD").

TiN layer 255 forms a barrier layer, configured for limiting, or even blocking, the diffusion of the filling metal (described hereafter) in the Ti.

As an example, Ti layer 254 has a uniform thickness of approximately 35 nm, and TiN layer 255 has a uniform thickness of approximately 15 nm.

Layers 253, 254, 255 generally comprise portions which continue outside of orifice 251 on the upper surface 142A (first surface) of dielectric region 142.

Figure 2C:
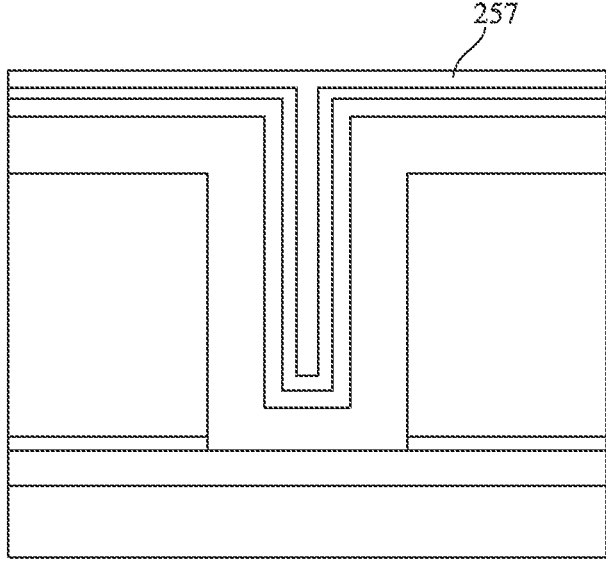

FIG. 2C shows the structure obtained at the end of a step of filling of the orifice coated with layers 253, 254, 255 with a filling metal (second metal), for example, made of tungsten (W). As an alternative to tungsten, the filling metal (second metal) may be copper.

This filling step may, for example, be carried out by using a CVD technique or an atomic layer deposition (ALD) technique.

This filling step results in the forming of a layer 257 comprising a substantially vertical portion of filling metal in orifice 251, in contact with TiN layer 255. Further, a substantially horizontal portion of the filling metal layer may cover the portions of layers 253, 254, 255 which continue outside of orifice 251.

Figure 2D:
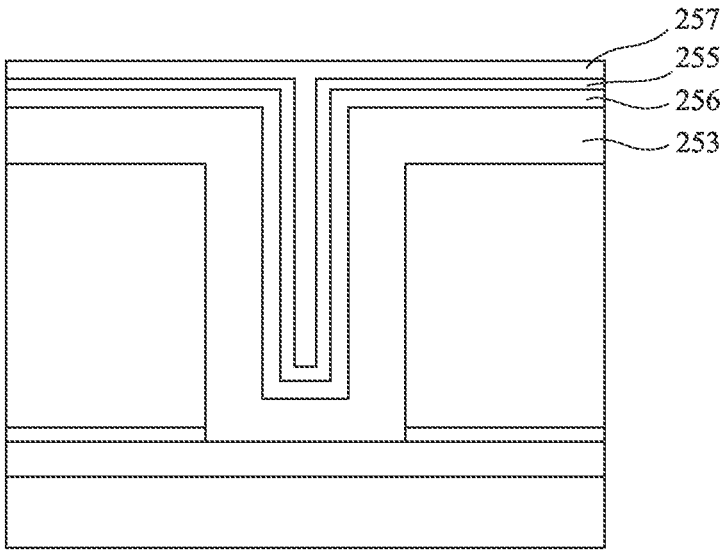

FIG. 2D shows the structure obtained at the end of a rapid thermal treatment step (rapid anneal), to have the polysilicon layer 253 react with the titanium of layer 254, resulting in the forming of a continuous layer 256 of titanium silicide (TiSi₂) which extends between the non-consumed residue of polysilicon layer 253 and TiN layer 255.

The treatment may, for example, be carried out at 675° C. for 30 seconds and under nitrogen (N₂).

The order of the filling and thermal treatment steps may be inverted. In other words, the filling step may be provided after the thermal treatment step.

Figure 2E:
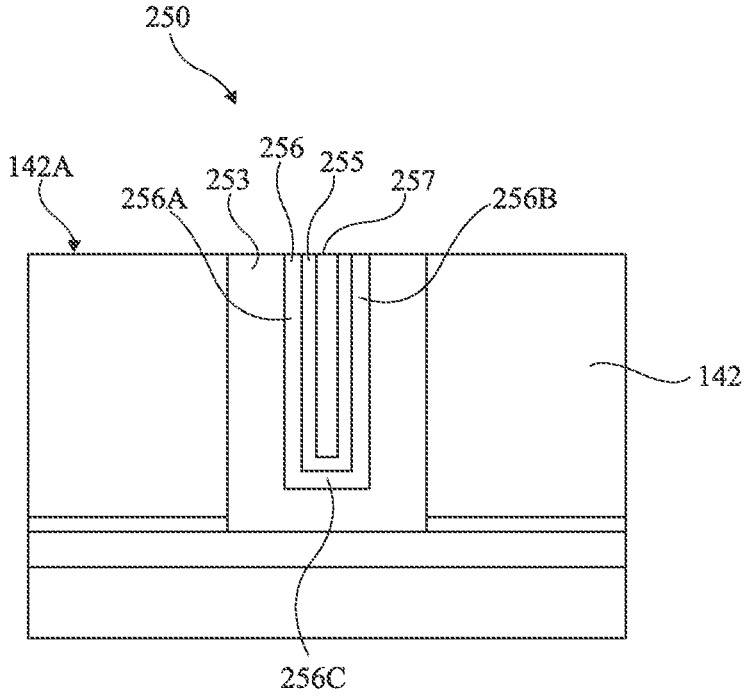

FIG. 2E shows the structure obtained at the end of a step of removal of the portions of layers 253, 254, 255, of the layer 257 of filling metal, and of titanium silicide layer 256, which extend above orifice 251 and above the upper surface 142A of dielectric region 142, to form a metal contact 250 flush with the upper surface 142A of dielectric region 142. This removal step (planarization) may be performed by chemical-mechanical polishing ("CMP").

After this planarization step, titanium silicide layer 256 is U-shaped, that is, comprises first and second vertical portions 256A, 256B coupled by a third horizontal portion 256C.

Figure 2F:
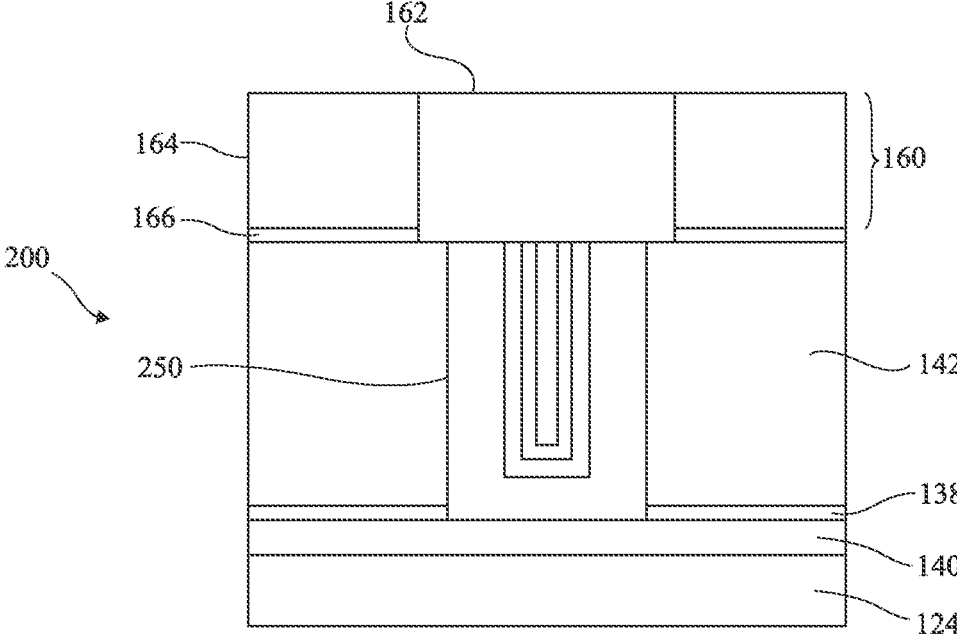

FIG. 2F shows the structure obtained at the end of a step of forming of a first metal level 162 of interconnection portion 160, formed on contact 250, which step may be similar to that described in relation with FIGS. 1A and 1B.

Although the method is described for a single semiconductor region, the method may be implemented to form, preferably simultaneously, contacts on a plurality of semiconductor regions of an electronic component.

Figure 2G:
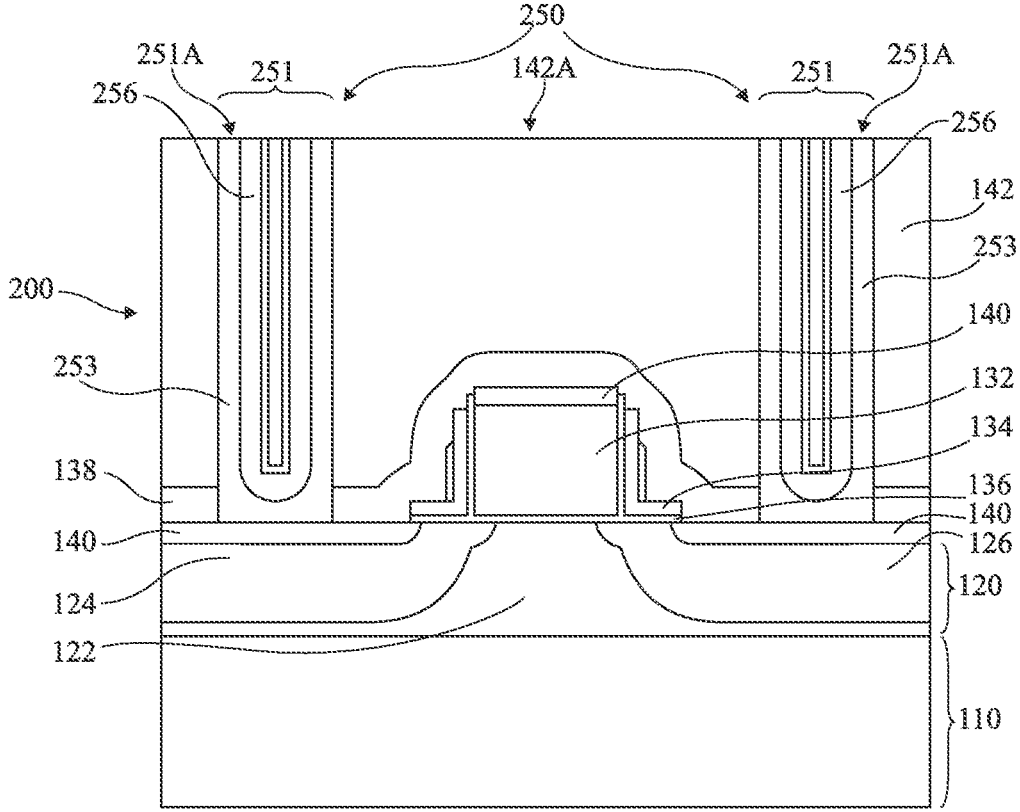
FIG. 2G shows an electronic component in cross-section comprising two contacts obtained by the manufacturing method of FIGS. 2A to 2F.

FIG. 2G shows an electronic component 200 comprising two contacts 250 obtained by the manufacturing method of FIGS. 2A to 2F.

The electronic component 200 of FIG. 2G differs from the electronic component of FIG. 1A mainly by its contacts 250. Indeed, each of the contacts 250 of electronic component 200 has a continuous U-shaped silicide layer 256 (TiSi₂ in the shown mode), flush with the upper aperture 251A of orifice 251 and extending practically all the way to the bottom 251B of said orifice, the silicide layer 256 being separated from the bottom 251B of the orifice by the thickness of polysilicon layer 253. The resistance of titanium silicide being approximately at least twice smaller than that of tungsten, this continuous silicide layer enables to significantly decrease the access resistance, and the general resistance, of the contact.

By adjusting the initial thickness of the polysilicon layer, in particular the polysilicon thickness at the bottom of the orifice, so that a major part of, or even all, the thickness of polysilicon at the bottom of the orifice is consumed at the end of the treatment step to form the silicide, silicide layer 256 may come at closest to, or even in contact with, silicide interface layer 140 on semiconductor region 124, 126, which may further decrease the access resistance and the general resistance of the contact.

The other elements of electronic component 200 may be similar to those described in relation with FIGS. 1A and 1B.

FIGS. 3A to 3F are cross-section views showing a method of manufacturing a contact 350 according to another embodiment.

Figure 3A:
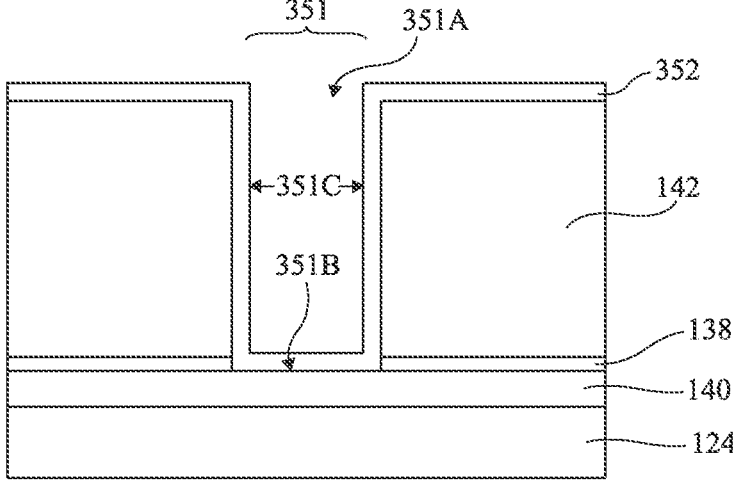
FIG. 3A, FIG. 3B, FIG. 3C, FIG. 3D, FIG. 3E, and FIG. 3F are cross-section views showing steps of a contact manufacturing method according to another embodiment.

FIG. 3A shows the structure obtained at the end of the deposition of a first layer 352 of Ti (third metal) on the initial structure, and in particular on the lateral walls 351C and at the bottom 351B of orifice 351. This layer forms a bonding layer, allowing the bonding of the stack of layers described hereafter on dielectric region 142 in the orifice.

Figure 3B:
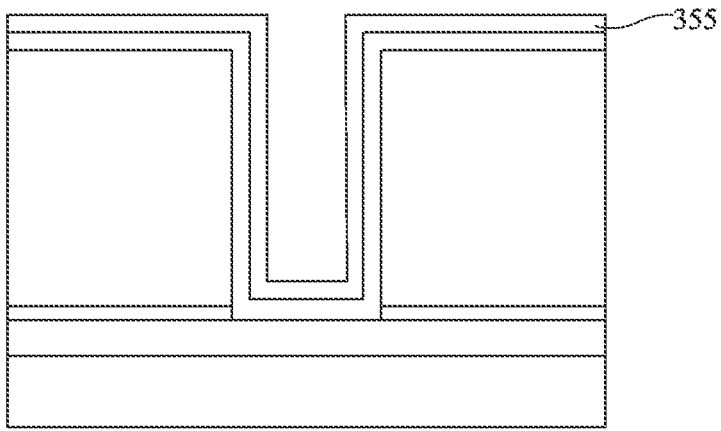

FIG. 3B shows the structure obtained at the end of the deposition of a TiN layer 355 on Ti bonding layer 352. This TiN layer 355 forms a barrier layer configured for limiting, or even blocking, the surface oxidation of the titanium, and thus avoiding the forming of titanium oxide that might block the reaction between the titanium and the polysilicon described hereafter.

Figure 3C:
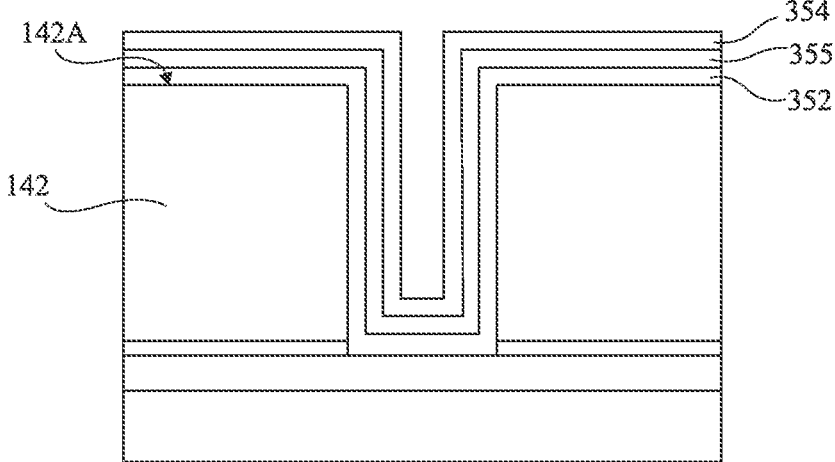

FIG. 3C shows the structure obtained at the end of the deposition of a second layer 354 of Ti (layer of the first metal) on barrier layer 355.

The depositions of these three layers may, for example, be performed by using a CVD technique or a PVD technique.

As an example, bonding layer 352 has a uniform thickness of approximately 15 nm, barrier layer 355 has a uniform thickness of approximately 15 nm, and the layer of first metal 354 has a uniform thickness of approximately 35 nm.

Layers 352, 355, 354 generally comprise portions which continue outside of orifice 351 on the upper surface 142A (first surface) of dielectric region 142.

Figure 3D:
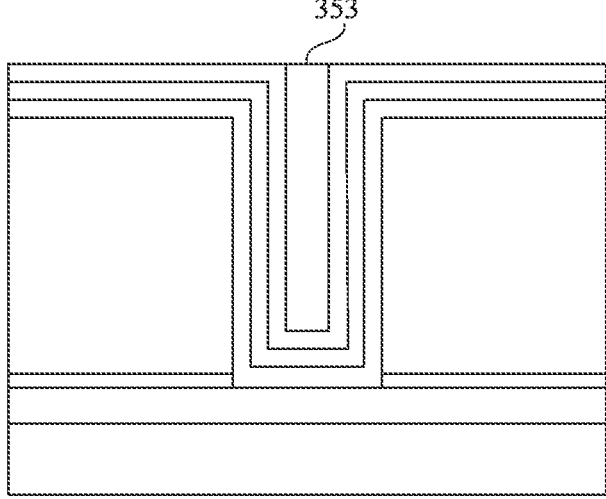

FIG. 3D shows the structure obtained at the end of a step of filling (obstructing) with polysilicon of the orifice coated with layers 352, 355, 354. The filling with polysilicon may be performed by using, for example, a CVD technique or by epitaxy.

This filling step results in the forming of a polysilicon layer 353 having a substantially vertical portion in orifice 351, in contact with the second layer 354 of Ti (layer of the first metal). Further, a substantially horizontal portion of polysilicon layer 353 may cover the portions of layers 352, 355, 354 which continue outside of orifice 351 (this substantially horizontal portion being removed, for example, using a CMP process).

Figure 3E:
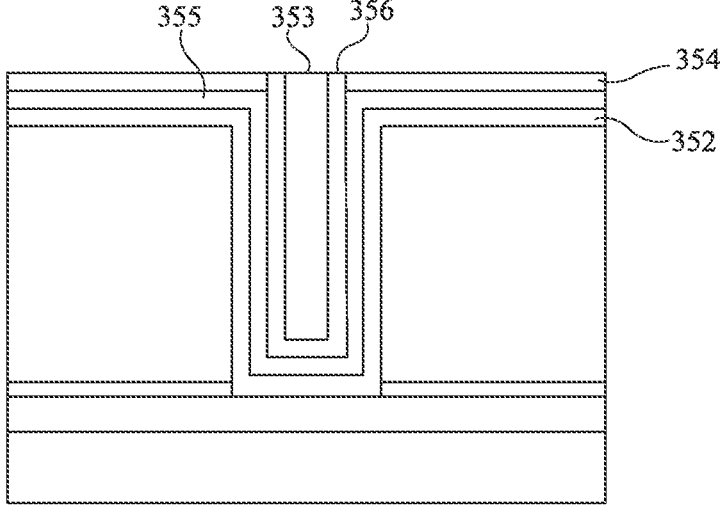

FIG. 3E shows the structure obtained at the end of a rapid thermal treatment step (rapid anneal) enabling to have the polysilicon layer 353 react with the titanium of layer 354, resulting in the forming of a continuous layer 356 of titanium silicide (TiSi₂) which extends between the non-consumed residue of polysilicon layer 353 and TiN layer 355.

The treatment may, for example, be performed at 675° C. for 30 seconds and under N₂.

Figure 3F:
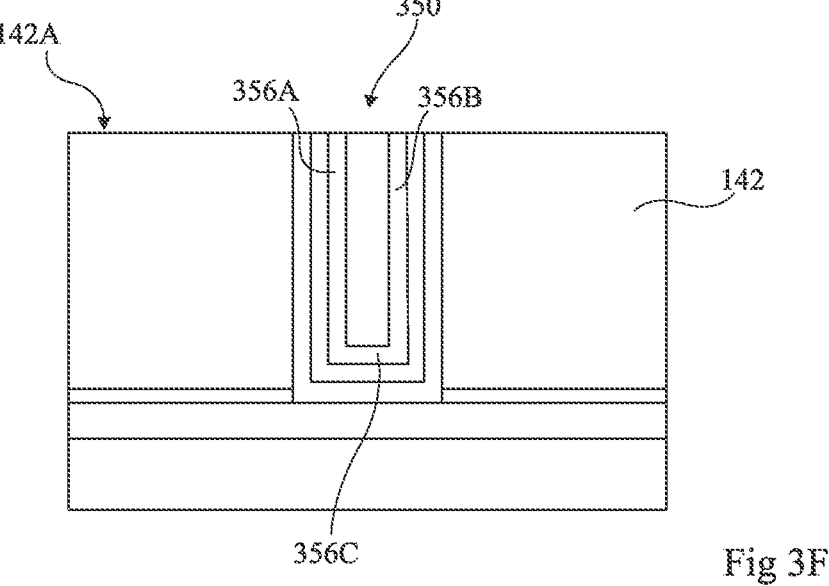

FIG. 3F shows the structure obtained at the end of a step of removal of the portions of layers 352, 355, 354, of polysilicon layer 353, and of titanium silicide 356 which extend above orifice 351 and above the upper surface 142A of dielectric region 142, to form a metal contact 350 flush with the upper surface 142A of dielectric region 142. This removal step (planarization) may be conventionally carried out by chemical-mechanical polishing (CMP).

After this planarization step, titanium silicide layer 356 is U-shaped, that is, comprises first and second vertical portions 356A, 356B coupled by a third horizontal portion 356C.

Similarly to what is described in relation with FIG. 2F, a first metal level of the interconnection portion may be formed on contact 350.

The embodiment of FIGS. 3A-3F may enable to further decrease the access resistance with respect to that of FIGS. 2A-2F.

FIGS. 4A to 4D are cross-section views showing a method of manufacturing a contact 450 according to another embodiment.

Figure 4A:
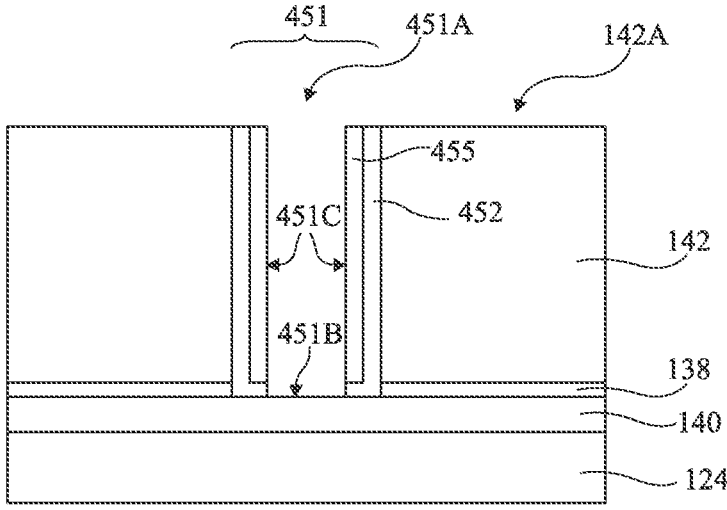
FIG. 4A, FIG. 4B, FIG. 4C, and FIG. 4D are cross-section views showing steps of a contact manufacturing method according to another embodiment.

It is started from a structure similar to the structure of FIG. 3B, with a bonding layer 452 made of Ti (third metal) and a barrier layer 455 made of TiN, after which portions of layers 452, 455 located at the bottom 451B of orifice 451 and on the planar surfaces on either side of said orifice are etched, for example by plasma etching, to access silicide interface layer 140. According to an example, the etching is anisotropic. FIG. 4A shows the structure obtained at the end of this etch step.

Figure 4B:
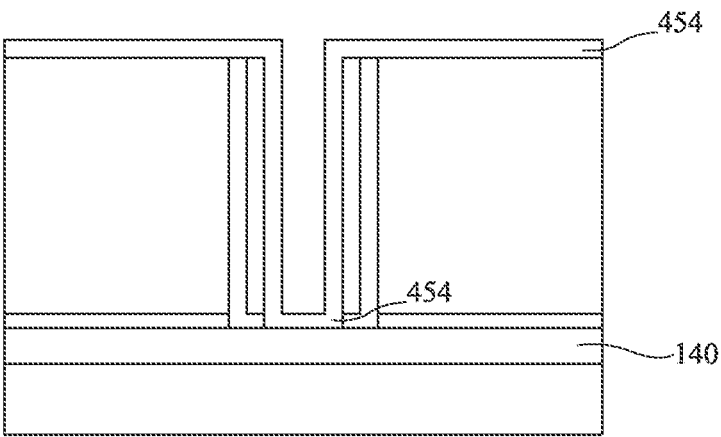

FIG. 4B shows the structure obtained at the end of the deposition of a second Ti layer 454 (layer of the first metal), similarly to the layer described in relation with FIG. 3C, to within the fact that, due to the etching, this second Ti layer 454 extends to the bottom 451B of orifice 451, in contact with silicide interface layer 140 on semiconductor region 124, and on the upper surface 142A of dielectric region 142.

Figure 4C:
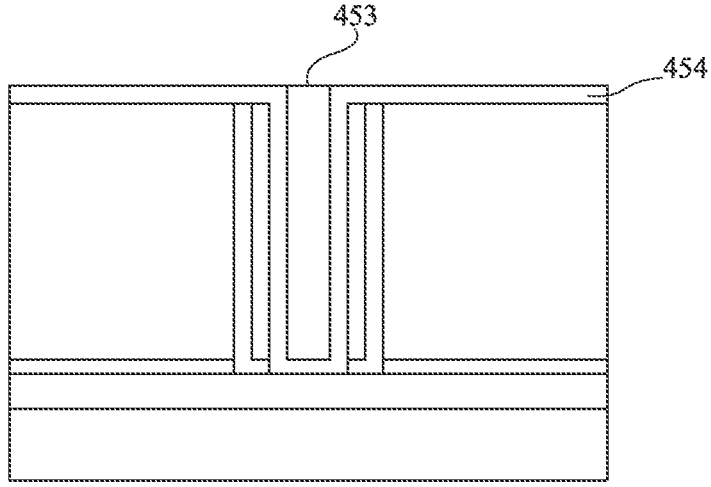

FIG. 4C shows the structure obtained at the end of a step of filling with polysilicon orifice 451, resulting in the forming of a polysilicon layer 453 comprising a substantially vertical portion in orifice 451 in contact with second Ti layer 454. The filling is similar to that described in relation with FIG. 3D.

Figure 4D:
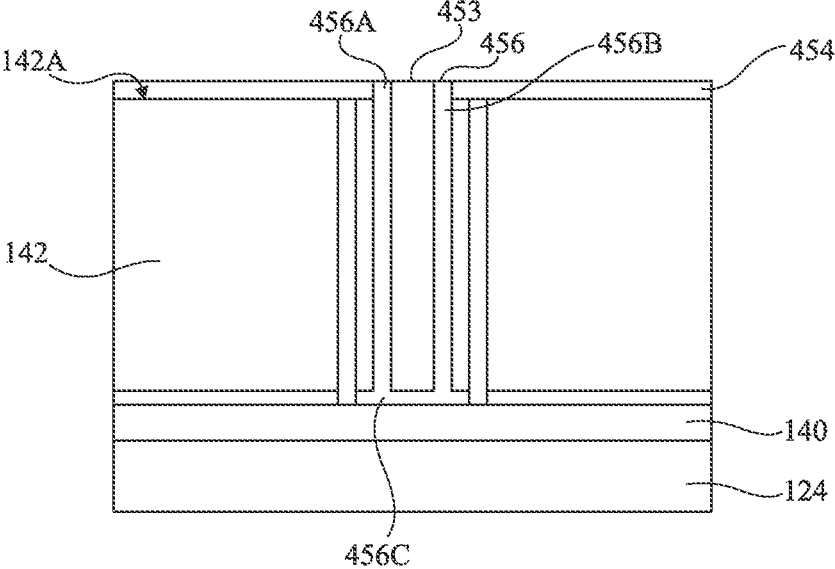

FIG. 4D shows the structure obtained at the end of a rapid thermal treatment step (rapid anneal) enabling to have the polysilicon of layer 453 react with the titanium of layer 454, resulting in the forming of a continuous layer 456 of titanium silicide (TiSi$_2$) which extends substantially in a U shape, with first and second vertical portions 456A, 456B coupled by a third horizontal portion 456C. This third horizontal portion 456C is in direct contact with silicide interface layer 140 on semiconductor region 124, which enables to further decrease the access resistance of the contact.

The thermal treatment may be similar to that described in relation with FIG. 3E.

Then, similarly to what is described in relation with FIG. 3F, a step of removal of the portions of layer 454, of polysilicon layer 453, and of titanium silicide layer 456 which extend above orifice 451 and/or above the upper surface 142A of dielectric region 142 is carried out, to form a metal contact 450 flush with the upper surface 142A of dielectric region 142.

The embodiment of FIGS. 4A-4D may enable to still further decrease the access resistance with respect to that of FIGS. 3A-3F.

Figure 4E:
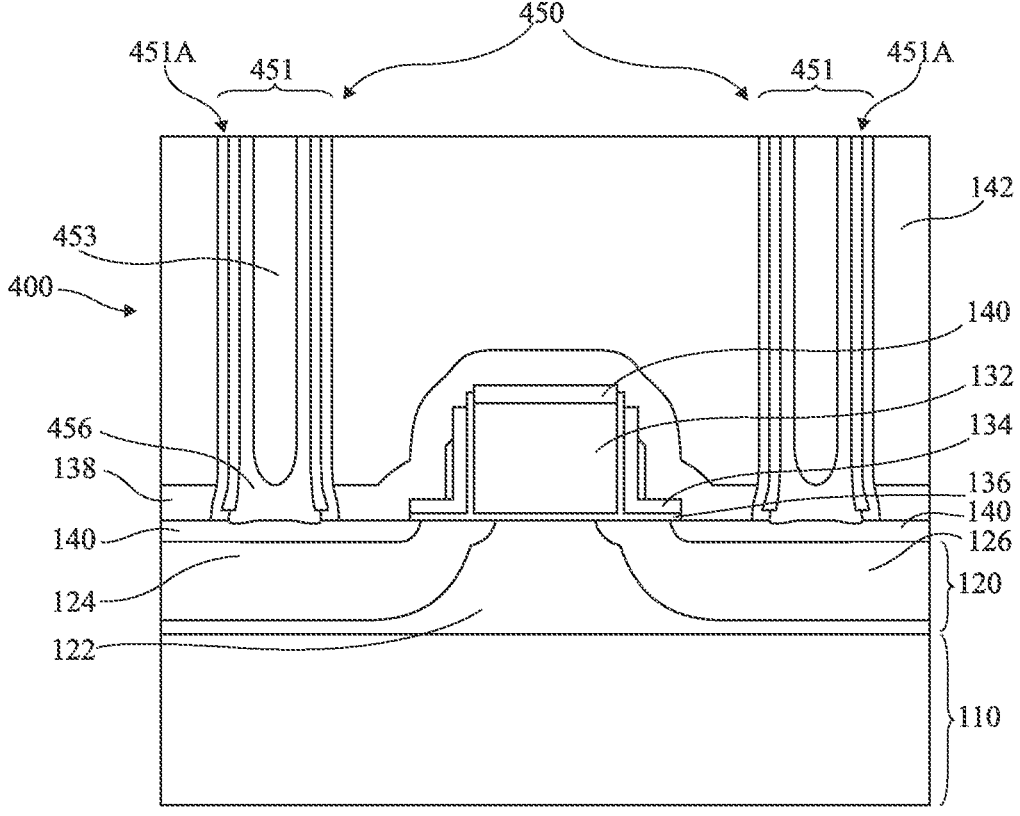
FIG. 4E shows an electronic component in cross-section comprising two contacts obtained by the manufacturing method of FIGS. 4A to 4D.

FIG. 4E shows an electronic component 400 comprising two contacts 450 obtained by the manufacturing method of FIGS. 4A to 4D.

Each of contacts 450 has a continuous U-shaped layer 456 of silicide (TiSi$_2$ in the shown mode), flush with the upper aperture 451A of orifice 451 and extending down to the bottom 451B of said orifice, in contact with silicide interface layer 140 on semiconductor region 124, 126. This enables to form an electric continuity between the silicides, and thus to further decrease the access resistance of the contact, and the general resistance of the contact all the way to the first metal level.

There has been shown in FIGS. 2A to 2F, 3A to 3F, 4A to 4D a drain region 124, but this might be a source and/or a gate region.

For the described embodiments, and more generally for a contact and a method of manufacturing a contact according to an embodiment, the first metal may, as an alternative to titanium, be another transition metal element, for example, cobalt (Co), or also nickel (Ni) or platinum (Pt), or even tungsten (W). The diffusion barrier layer may as an alternative to Ti/TiN, be a tantalum/tantalum nitride (Ta/TaN) bilayer, or any other layer or multilayer configured for forming a diffusion barrier. The third metal, for the bonding layer may, as an alternative to Ti, be tantalum (Ta) or Ni.

Depending on the selected first metal, the silicide formed by the reaction with polysilicon may be, for example, a titanium silicide, a cobalt silicide, or also a nickel silicide, a platinum silicide, or even a tungsten silicide.

In the described embodiments, the considered electronic component is a MOS transistor, but this is not limiting, and the described embodiments may apply to another type of transistor or more widely to any other electronic component comprising a semiconductor region intended to be electrically connected via a contact.

There appears from the description that the embodiments enable to decrease the general resistance of the contact between the silicided semiconductor region on which it is formed and the first metal level.

Thus, for example, the embodiments enable to minimize the Ron of a transistor, without for this to impact other performance factors of the transistor, for example, without for this to impact the Coff. Further, this effect may cumulate with other improvements to minimize the Ron and/or the Coff, for example, with improvements made to the very structure of the transistor.

The embodiments may find applications for electronic components used in RF (radio frequency) communication applications, for example, for RF signal switching technologies (RF switch) and/or radio antenna front-end modules (FEM). In particular for RF switches, it is advantageous to decrease the access resistance of the contacts.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

The invention claimed is:

1. A method of manufacturing a contact on a semiconductor region of an electronic component, comprising:
  forming a stack of layers that are electrically conductive on lateral walls and at a bottom of an orifice crossing a dielectric region of the electronic component along a longitudinal direction;
  wherein the bottom of the orifice is aligned with the semiconductor region;
  wherein forming the stack of layers is carried out from a first surface of said dielectric region and comprises:
    forming a polysilicon layer and a layer of a first metal in contact with the polysilicon layer, said first metal being selected from the group of transition metals suitable for forming with the polysilicon a metal silicide; and
    then performing a thermal anneal to cause the first metal to react with the polysilicon layer to form a layer of metal silicide;

wherein the layer of metal silicide includes at least a portion extending in the longitudinal direction of the orifice; and wherein the layer of the first metal is formed before the polysilicon layer on lateral walls and at the bottom of the orifice.

2. The method according to claim 1, wherein the electronic component comprises a silicide interface layer providing an interface between said semiconductor region and the contact, and wherein the bottom of the orifice emerges onto said silicide interface layer.

3. The method according to claim 1, wherein the thermal anneal is carried out at a temperature in a range from 500° C. to 850° C., and for a duration in a range from 30 seconds to 5 minutes.

4. The method according to claim 1, wherein forming further comprises forming a diffusion barrier layer before the layer of the first metal and wherein said layer of the first metal is in contact with the diffusion barrier layer.

5. The method according to claim 4, wherein forming comprises a step of etching, at least at the bottom of the orifice, a portion of the diffusion barrier layer, the step of etching being before the forming of the layer of the first metal.

6. The method according to claim 4, wherein forming further comprises forming a bonding layer on the lateral walls and at the bottom of the orifice before the diffusion barrier layer and in contact with said diffusion barrier layer.

7. The method according to claim 6, wherein:

the bonding layer is made of a material selected from the group consisting of:

titanium, cobalt, or nickel; and the diffusion barrier layer is made of a material selected from the group consisting of: titanium nitride and a tantalum/tantalum nitride bilayer.

8. The method according to claim 1, wherein forming further comprises forming a bonding layer on the lateral walls and at the bottom of the orifice before the layer of the first metal and wherein said layer of the first metal is in contact with the bonding layer.

9. The method according to claim 1, wherein forming the polysilicon layer comprises filling the orifice.

10. The method according to claim 1, further comprising planarizing the layers of the stack in order to make the contact flush with the first surface of the dielectric region, wherein planarizing comprises performing a chemical-mechanical polishing.

11. The method according to claim 1, wherein said electronic component comprises a transistor arranged inside and on top of a substrate, the transistor comprising a gate semiconductor region covering a channel region located between a drain semiconductor region and a source semiconductor region, said at least one contact being arranged on one of the drain semiconductor region, the source semiconductor region, and the gate semiconductor region, and wherein a silicide interface layer is interposed between said semiconductor region and the contact.

12. The method according to claim 1, wherein:

the first metal is selected from the group consisting of: titanium, cobalt, platinum, nickel, or tungsten; and the metal silicide is selected from the group consisting of: a titanium silicide, a cobalt silicide, a platinum silicide, a nickel silicide, or a tungsten silicide.

13. A method of manufacturing a contact on a semiconductor region of an electronic component, comprising:

forming an orifice crossing a dielectric region of the electronic component, said orifice exposing the semiconductor region;

forming a stack of layers that are electrically conductive on lateral walls and at a bottom of the orifice;

wherein forming the stack of layers comprises:

forming a layer of a first metal on the lateral walls and bottom of the orifice;

forming a polysilicon layer on the layer of the first metal;

wherein the first metal is selected from the group consisting of titanium, cobalt, platinum, nickel and tungsten; and then performing a thermal anneal to cause a reaction between the first metal and the polysilicon layer to form a layer of metal silicide;

wherein the layer of metal silicide includes at least a portion extending in a longitudinal direction of the orifice.

14. The method according to claim 13, wherein forming further comprises forming a diffusion barrier layer in said orifice before forming the layer of the first metal.

15. The method according to claim 14, further comprising etching a portion of the diffusion barrier layer before forming the layer of the first metal.

16. The method according to claim 14, further comprising forming a bonding layer on the lateral walls and bottom of the orifice before forming the diffusion barrier layer.

17. The method according to claim 16, further comprising etching a portion of the bonding layer before forming the layer of the first metal.

18. The method according to claim 13, wherein forming the polysilicon layer comprises filling the orifice.

19. The method according to claim 13, wherein said electronic component comprises a transistor arranged inside and on top of a substrate, the transistor comprising a gate semiconductor region covering a channel region located between a drain semiconductor region and a source semiconductor region, said at least one contact being arranged on one of the drain semiconductor region, the source semiconductor region, and the gate semiconductor region, and wherein a silicide interface layer is interposed between said semiconductor region and the contact.

* * * * *